United States Patent
Lin et al.

(10) Patent No.: US 7,317,780 B2
(45) Date of Patent: Jan. 8, 2008

(54) SHIFT REGISTER CIRCUIT

(75) Inventors: Wei-Cheng Lin, Wurih Township, Taichung County (TW); Chun-Ching Wei, Taipei (TW); Yang-En Wu, Taipei (TW); Cheng-Liang Ma, Caotun Township, Nantou County (TW)

(73) Assignee: AU Optronics Corp., Hsinchu (TW)

( * ) Notice: Subject to any disclaimer, the term of this patent is extended or adjusted under 35 U.S.C. 154(b) by 93 days.

(21) Appl. No.: 11/362,213

(22) Filed: Feb. 24, 2006

(65) Prior Publication Data
US 2007/0035505 A1 Feb. 15, 2007

(30) Foreign Application Priority Data
Aug. 11, 2005 (TW) .............................. 94127303 A

(51) Int. Cl.
*G11K 19/00* (2006.01)
*H03K 19/00* (2006.01)

(52) U.S. Cl. .............................. 377/67; 326/93; 326/97; 377/64; 365/78

(58) Field of Classification Search ............ 377/64–81; 345/100, 104
See application file for complete search history.

(56) References Cited

U.S. PATENT DOCUMENTS

| 5,410,583 | A | * | 4/1995 | Weisbrod et al. ............. 377/75 |
| 5,949,398 | A | * | 9/1999 | Kim ............................ 345/100 |
| 6,064,713 | A | * | 5/2000 | Lebrun et al. ................ 377/67 |
| 2004/0234020 | A1 | * | 11/2004 | Yu ............................... 377/64 |
| 2006/0267912 | A1 | * | 11/2006 | Lee et al. ..................... 345/100 |
| 2007/0071158 | A1 | * | 3/2007 | Wei et al. ..................... 377/64 |
| 2007/0086558 | A1 | * | 4/2007 | Wei et al. ..................... 377/64 |

* cited by examiner

Primary Examiner—Rexford Barnie
Assistant Examiner—Dylan White
(74) Attorney, Agent, or Firm—Thomas, Kayden, Horstemeyer & Risley

(57) ABSTRACT

A shift registers circuit having a series of cascading shift registers comprises a first transistor coupling to an output signal of a pre-stage shift register, a second transistor coupling to the first transistor, an output and a first clock signal, and a pull-down module coupling to the output, output signals of pre-stage and post-stage shift register, a second and a third voltage level. When the second transistor turns on and the first clock signal is at high voltage level, the output is at a first voltage level. When the signal of post-stage shift register is at first voltage level, the output is at the third voltage level.

21 Claims, 12 Drawing Sheets

SHIFT REGISTER CIRCUIT

BACKGROUND

The invention relates to a driver circuit of a liquid crystal display, and more particularly to a driver circuit with three driving voltage levels.

In the active driving technology of liquid crystal display (hereinafter, referred to as an "LCD"), amorphous Si transistors serves as switches for each pixel, wherein the gate of the amorphous Si transistor is coupled to a gate line, the source of the amorphous Si transistor is coupled to a data line, and the drain of the-amorphous Si transistor is coupled to the pixel. When the gate line is at high voltage level, the amorphous Si transistor turns on and thus the pixel obtain the voltage from the data line. When the gate line is at low voltage level, the amorphous Si transistor turns off and the voltage level of the source remains. Because a coupling capacitor $C_{gs}$ exists between the gate and source, the source voltage level generates a voltage drop, feedthrough voltage $\Delta V_{gd}$, when the voltage of gate changes from high to low voltage level. Thus, the LCD cannot show the correct gray level due to the feedthrough voltage.

Please refer to FIG. 1. FIG. 1 is a schematic diagram of the voltage level of the gate, source and drain of a conventional shift register. During the time period t1, the drain is at a high voltage level VDD, and when the gate is at a high voltage level, the voltage level of the source increases to VDD and then a voltage drop $\Delta V_{gd}$ is generated due to the coupling capacitor $C_{gs}$. During the time period t2, the drain is at a low voltage level Vss, and when the gate is at a high voltage level, the voltage level of the source decreases to Vss and then a voltage drop $\Delta V_{gd}$ is generated due to the coupling capacitor $C_{gs}$. According to the conventional shift register of FIG. 1, the TFT transistor cannot stay at a predetermined voltage level due to the coupling capacitor $C_{gs}$, and thus, the LCD cannot show the correct gray level.

SUMMARY

The invention provides a shift register capable of reducing the feedthrough voltage.

The invention provides a shift register with three driving voltage levels to reduce or eliminate the feedthrough voltage.

In one aspect of the invention, a shift register circuit having a series of cascading shift registers comprising a first transistor, a second transistor, and a pull-down module is provided. The first transistor has a gate, a first source/drain and a second source/drain, wherein the gate and the first source/drain of the first transistor are coupled to an output signal of a pre-stage shift register. The second transistor having a gate, a first source/drain and a second source/drain, wherein the gate of the second transistor is coupled to the second source/drain of the first transistor, the first source/drain of the second transistor is coupled to a first clock signal, and the second source/drain of the second transistor is coupled to an output, wherein the output is at a first voltage level when the second transistor is on and the first clock signal is at a high voltage level. The pull-down module is coupled to the output, the output signal of the pre-stage shift register, an output signal of a post-stage shift register, a second and a third voltage level, wherein the output is at the second voltage level when an output signal of the post-stage shift register is at the second or the third voltage level, and the output is coupled to the third voltage level when an output signal of the post-stage shift register is at the first voltage level.

In one aspect of the invention, a shift register circuit having a serious of cascading shift registers comprises the following elements: a first transistor having a gate, a first source/drain and a second source/drain, wherein the gate and the first source/drain of the first transistor is coupled to an output signal of a pre-stage shift register; a second transistor having a gate, a first source/drain and a second source/drain, wherein the gate of the second transistor is coupled to the second source/drain of the first transistor, the first source/drain of the second transistor is coupled to a first clock signal, and the second source/drain of the second transistor is coupled to an output, wherein the output is at a first voltage level. when the second transistor is on and the first clock signal is at a high voltage level; a third transistor having a gate, a first source/drain and a second source/drain, wherein the gate of the third transistor is coupled to the output, and the second source/drain of the third transistor is coupled to a second voltage level; a fourth transistor having a gate, a first source/drain and a second source/drain, wherein the gate of the fourth transistor is coupled to an output signal of a post-stage shift register, the first source/drain of the fourth transistor is coupled to the first source/drain of the third transistor, and the second source/drain is coupled to the second voltage level; a fifth transistor having a gate, a first source/drain and a second source/drain, wherein the first source/drain of the fifth transistor is coupled to the output, the second source/drain of the fifth transistor is coupled to a third voltage level, and the gate of the fifth transistor is coupled to the gate of the fourth transistor; a sixth transistor having a gate, a first source/drain and a second source/drain, wherein the gate of the sixth transistor is coupled to the gate of the fourth transistor, the second source/drain of the sixth transistor is coupled to the second voltage level, and the first source/drain is coupled to the gate of the second transistor; a seventh transistor having a gate, a first source/drain and a second source/drain, wherein the first source/drain of the seventh transistor is coupled to output, the second source/drain of the seventh transistor is coupled to the second voltage level, and the gate of the seventh transistor is coupled to second source/drain of the fourth transistor; an eighth transistor having a gate, a first source/drain and a second source/drain, wherein the first source/drain of the eighth transistor is coupled to the gate of the second transistor, the second source/drain of the eighth transistor is coupled to the second voltage level, and the gate of the eighth transistor is coupled to the gate of the seventh transistor; a ninth transistor having a gate, a first source/drain and a second source/drain, wherein the gate and the first source/drain of the ninth transistor is coupled to a second clock signal, and the second source/drain of the ninth transistor is coupled to the gate of the eighth transistor; a tenth transistor having a gate, a first source/drain and a second source/drain, wherein the second source/drain of the tenth transistor is coupled to the second voltage level, the gate of the tenth transistor is coupled to the first clock signal, and the first source/drain of the tenth transistor is coupled to the gate of the eighth transistor; a eleventh transistor having a gate, a first source/drain and a second source/drain, wherein the second source/drain of the eleventh transistor is coupled to the second voltage level, the gate of the eleventh transistor is coupled to the output signal of the pre-stage shift register; a twelfth transistor having a gate, a first source/drain and a second source/drain, wherein the second source/drain of twelfth transistor is coupled to the second voltage level, and the gate of twelfth transistor is coupled to the output; a thirteenth transistor having a gate, a first source/drain and a second source/drain, wherein the first source/drain of the thirteenth transistor is coupled to the output, the second source/drain of the thirteenth transistor is coupled to the second voltage level, and the gate of the thirteenth transistor is coupled to the first source/drain of the twelfth transistor; a fourteenth transistor having a gate, a first source/drain and a second source/drain, wherein the second source/drain of the fourteenth transistor is coupled to the second voltage level, the gate of the fourteenth transistor is coupled to the gate of the thirteenth transistor, and the first source/drain of the fourteenth transistor is coupled to the gate of the second transistor; a fifteenth transistor having a gate, a first source/drain and a second source/drain, wherein the gate and the first source/drain of the fifteenth transistor are coupled to the first clock signal, and the second source/drain of the fifteenth transistor is coupled to the gate of the thirteenth transistor; a sixteenth transistor having a gate, a first source/drain and a second source/drain, wherein the second source/drain of the sixteenth transistor is coupled to the second voltage level, the gate of sixteenth transistor is coupled to the second clock signal, and the first source/drain of sixteenth transistor is coupled to the gate of thirteenth transistor.

DETAILED DESCRIPTION

Figure 2:
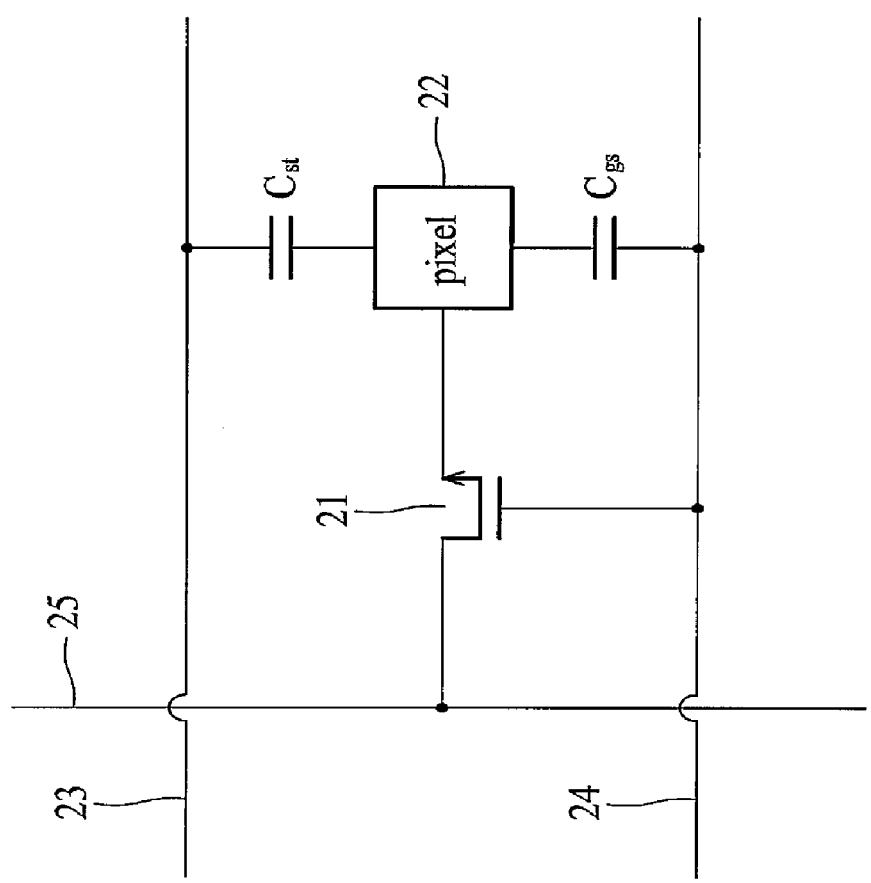
FIG. 2 is a schematic diagram of a pixel of a panel according to the invention

FIG. 2 is a schematic diagram of a pixel of a panel according to the invention. TFT transistor 21 is coupled to gate line 24, data line 25 and pixel 22. The coupling capacitor $C_{gs}$ is generated between the pixel 22 and the gate line 24, and the coupling capacitor $C_{st}$ is generated between the pixel 22 and the gate line 24.

Figure 1:
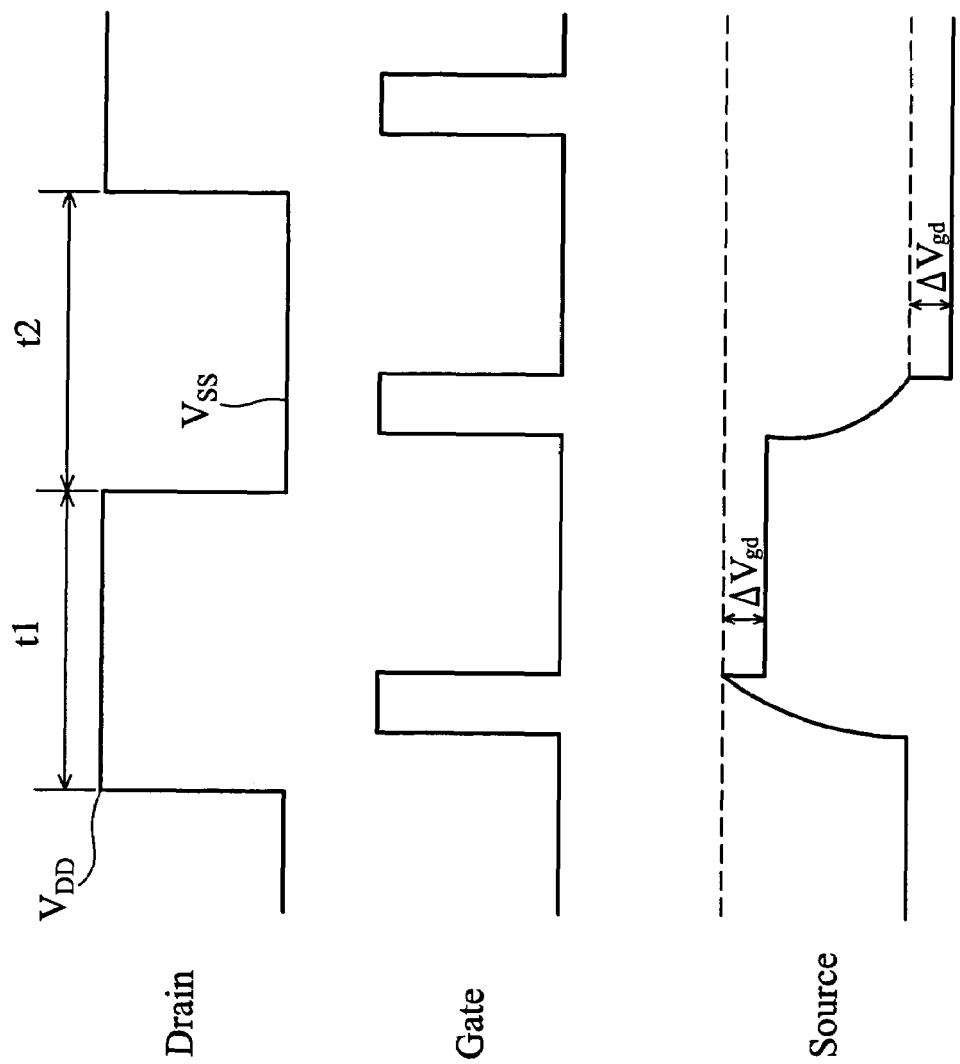
FIG. 1 is a schematic diagram of the voltage level of gate, source and drain according to a conventional shift register.
Figure 3:
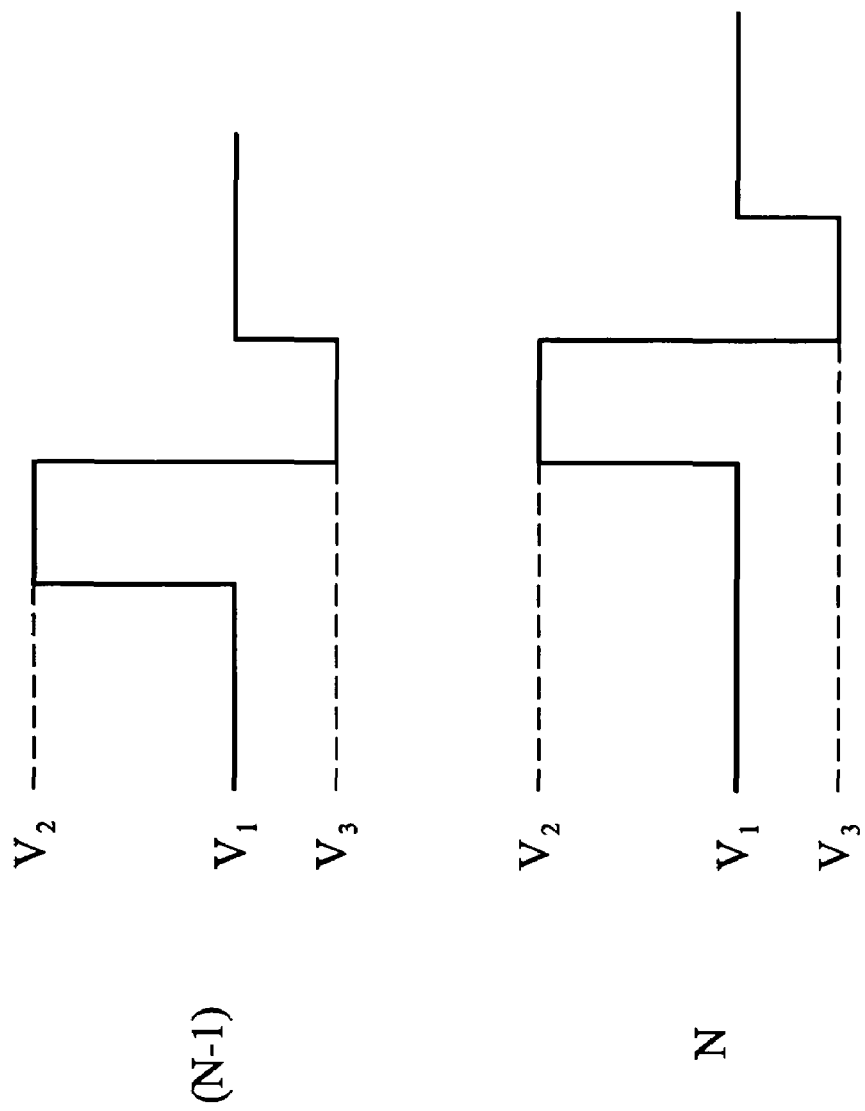
FIG. 3 is a schematic diagram of a three-level driving method of the gate voltage.

FIG. 3 is a schematic diagram of a three-level driving method of the gate voltage. When the voltage of $N_{th}$ gate line drops from voltage $V_2$ to voltage $V_3$, a feedthrough voltage is generated because of the coupling capacitor $C_{gs}$, and the voltage of pixel, such as pixel 22 of FIG. 1, increase slightly because of the coupling capacitor $C_{st}$ caused by voltage of the $(N-1)_{th}$ gate line increasing from $V_3$ to $V_1$. According to the driving method above, the issue of the pixel that cannot show the correct gray level can be reducing.

Figure 4:
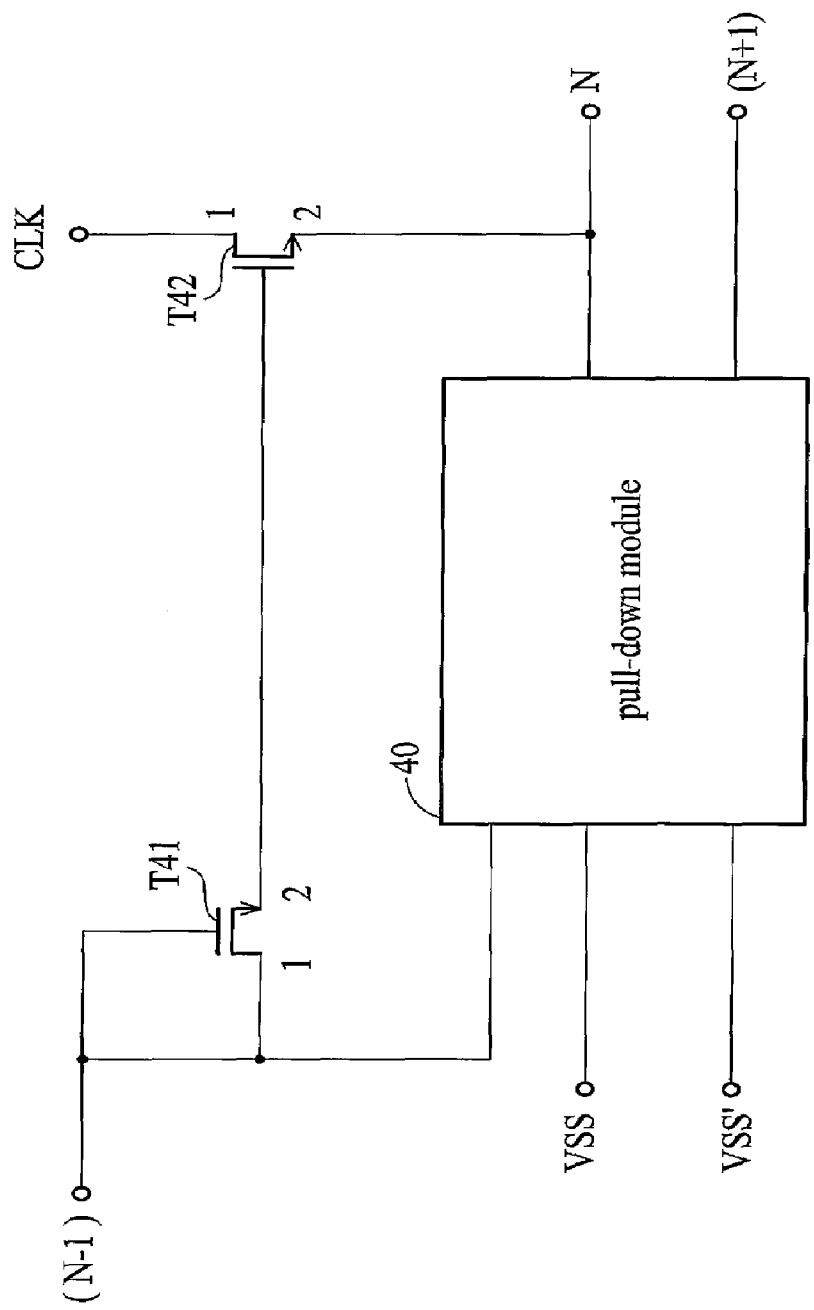
FIG. 4 is a schematic diagram of a shift register according to the invention.

FIG. 4 is a schematic diagram of a shift register according to the invention. The gate and first source/drain of transistor T41 are coupled to an output signal N−1 of a pre-stage shift register and a pull-down module 40. The gate of transistor T42 is coupled to the second source/drain of the transistor T41, the first source/drain of the transistor T42 is coupled to a clock signal CLK, and the second source/drain of the transistor T42 is coupled to the pull-down module 40 and the output signal N of the shift register. The pull-down module 40 further coupled to an output signal N+1 of a post-stage shift register, a second voltage level Vss and a third voltage level Vss'. When the transistor T42 is on and the clock signal CLK is at high voltage level, the output signal N is at a first voltage level. When the output signal N+1 is at the second or third voltage level, the output signal N is at the second voltage Vss. When the output signal N+1 is at the first voltage level, the output signal is at the third voltage level Vss'. According to the driving method above, the shift register of the invention is driven by three voltage levels.

According to f the invention, the pull-down module 40 is a circuit formed by one or a plurality of multiplexers, transistors and/or logic gates.

Figure 5:
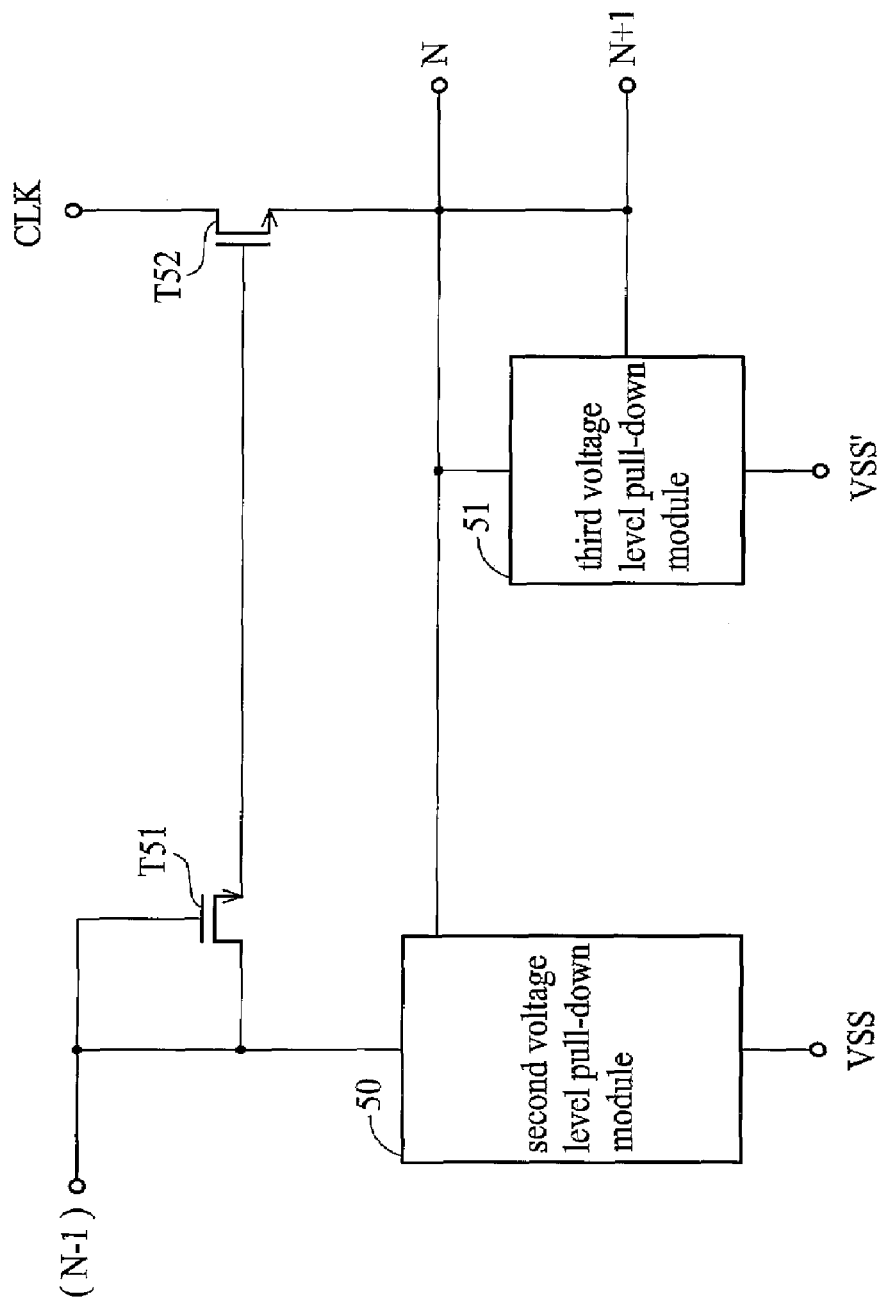
FIG. 5 is a shift register of a second embodiment of the invention.

FIG. 5 is a shift register of a second embodiment of the invention. The gate and first source/drain of transistor T51 are coupled to an output signal N−1 of a pre-stage shift register and a second voltage level pull-down module 50. The gate of transistor T52 is coupled to the second source/drain of transistor T51, the first source/drain of transistor T52 is coupled to a clock signal CLK, and the second source/drain of transistor T52 is coupled to the output signal N. The second voltage level pull-down module 50 couples the output signal N, the output signal N+1 of a post-stage shift register and a second voltage level Vss. The third voltage level pull-down module 51 coupled the output signal N, N+1 and a third voltage level Vss'. When the transistor T52 turns on and the clock signal CLK is at high voltage level, the output signal N is at a first voltage level. When the output signal N−1 is at the second or third voltage level, the output signal N is coupled to the second voltage Vss via the second voltage level pull-down module 50. When the output signal N+1 is at the first voltage level, the output signal N is coupled to Vss' via the third voltage level pull-down module 51.

In FIG. 5, the second voltage level pull-down module 50 and the third voltage level pull-down module 51 are made of one or combination of multiplexers, transistors, logic gates and similar elements.

Figure 6A:
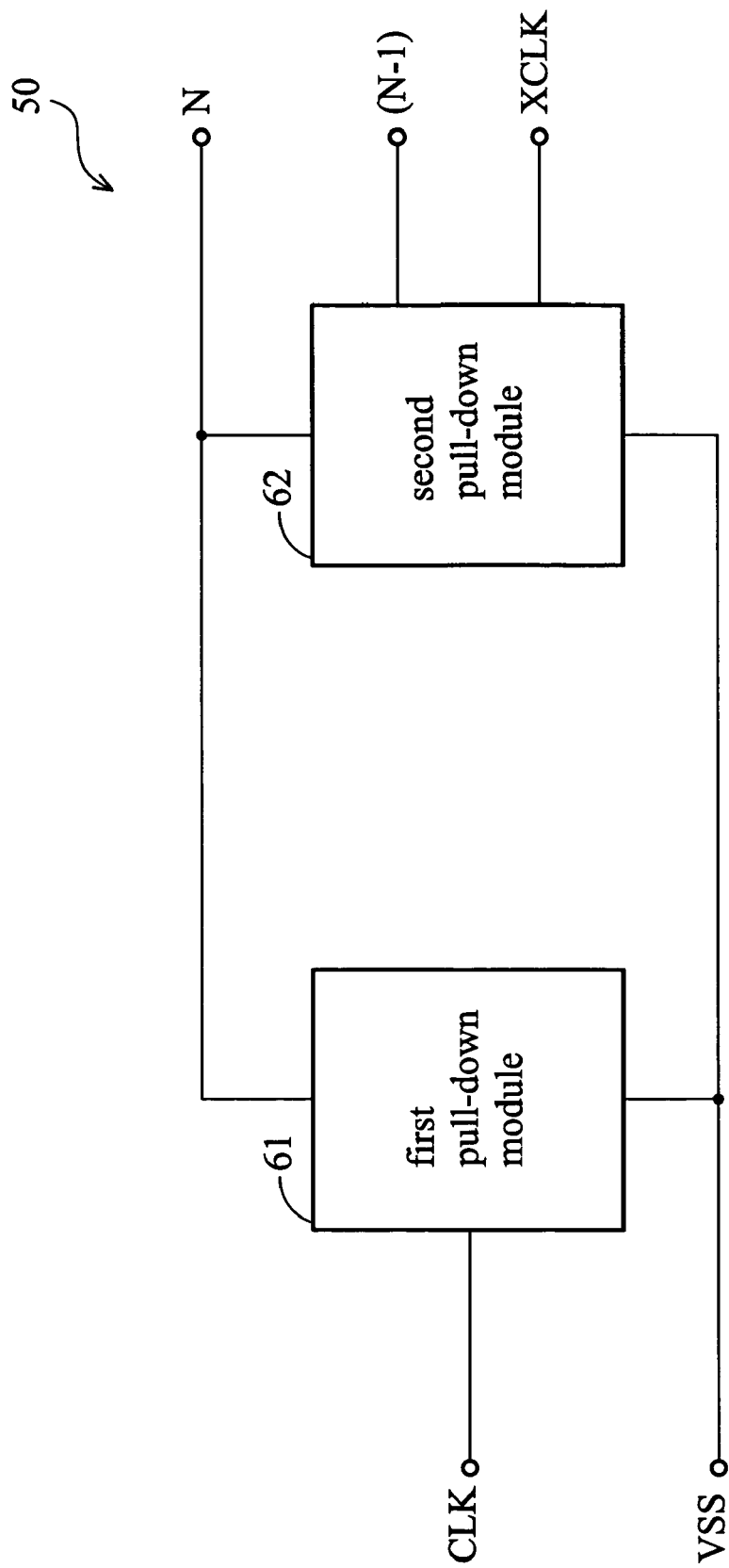
FIG. 6A is a schematic diagram of a first embodiment of the second voltage level pull-down module 50 of FIG. 5.

FIG. 6A is a schematic diagram of a first embodiment of the second voltage level pull-down module 50 of FIG. 5. In FIG. 6A, the second voltage level pull-down module 50 comprises a first pull-down module 61 and a second pull-down module 62. The first pull-down module 61 couples the first clock signal CLK, the output signal N and the second voltage level VSS. The second pull-down module 62 couples the second clock signal XCLK, the output signal N, the output signal N−1 and the second voltage level VSS. When the first clock signal CLK is at the high voltage level, the output signal N is coupled to Vss via the first pull-down module 61. When the output signal N−1 is at the second voltage level Vss and the second clock signal XCLK is at the high voltage level, the output signal N is coupled to Vss via the first pull-down module 62.

Figure 6B:
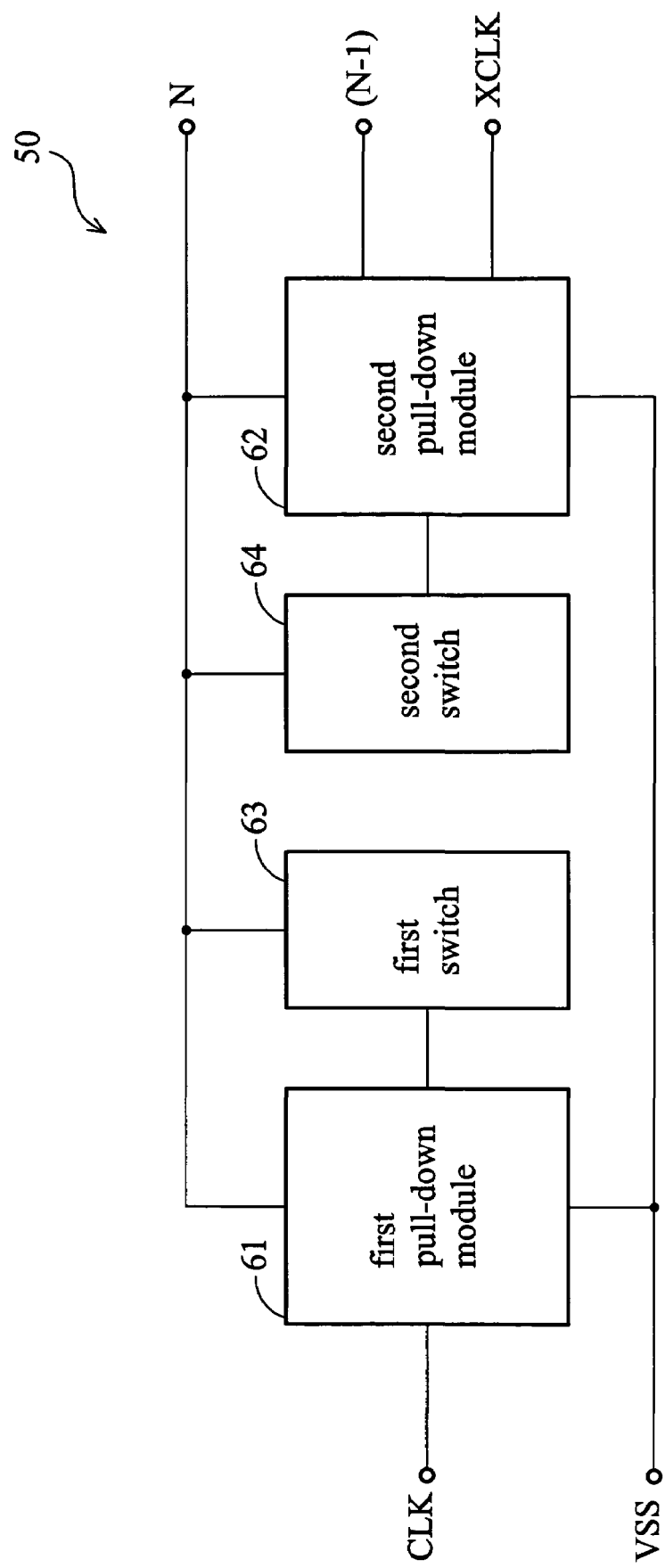
FIG. 6B is a schematic diagram of a second embodiment of the second voltage level pull-down module 50 of FIG. 5.

FIG. 6B is a schematic diagram of a second embodiment of the second voltage level pull-down module 50 of FIG. 5.

In FIG. 6B, the second voltage level pull-down module 50 comprises a first pull-down module 61, a second pull-down module 62, a first switch 63 and a second switch 64. The first pull-down module 61 couples the first clock signal CLK, a first switch 63, the output signal N and the second voltage level VSS. The second pull-down module 62 couples the second clock signal XCLK, a second switch 64, the output signal N, the output signal N−1 and the second voltage level VSS. When the output signal N is at high voltage level, the first switch 63 and the second switch respectively turn off the first pull-down module 61 and the second pull-down module. When the first clock signal CLK is at the high voltage level, the output signal N is coupled to Vss via the first pull-down module 61. When the output signal N−1 is at the second voltage level Vss and the second clock signal XCLK is at the high voltage level, the output signal N is coupled to Vss via the first pull-down module 62.

In FIG. 6, the first pull-down module 61 and the second pull-down module 62 are made of one or combination of multiplexers, transistors, logic gates and similar elements.

Figure 7:
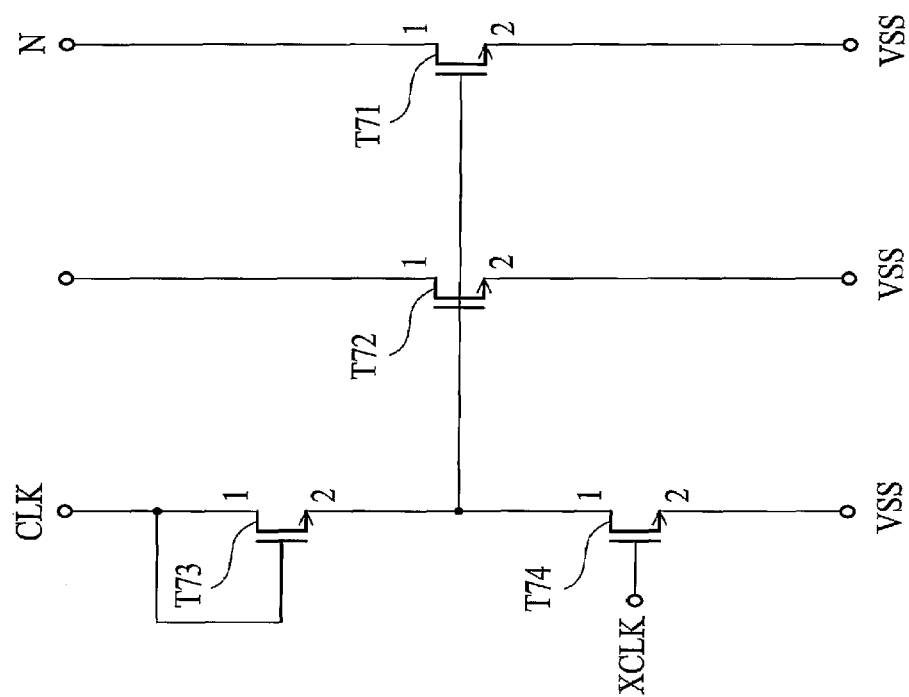
FIG. 7 is a circuit diagram of an embodiment of the first pull-down module 61 of FIG. 6A.

FIG. 7 is a circuit diagram of an embodiment of the first pull-down module 61 of FIG. 6A. The first source/drain of transistor T71 is coupled to the output signal N, and the second source/drain of transistor T72 is coupled to the second voltage Vss. The second source/drain of transistor T72 is coupled to Vss and the gate of transistor T72 is coupled to the gate of transistor T71. The gate and first source/drain of transistor T73 are coupled to the first clock signal, and the second source/drain of transistor T73 is coupled to the gate of transistor T71. The second source/drain of transistor T74 is coupled to Vss, the gate of transistor T74 is coupled to the second clock signal XCLK, and the first source/drain of transistor T74 is coupled to the gate of transistor T71. When the first clock signal CLK is at high voltage level and thus, the second clock signal XCLK is at low voltage level, the transistor T73 turns on and the transistor T74 turns off. The transistors T71 and T72 also turn on, thus, the output signal N is coupled to Vss.

Figure 8:
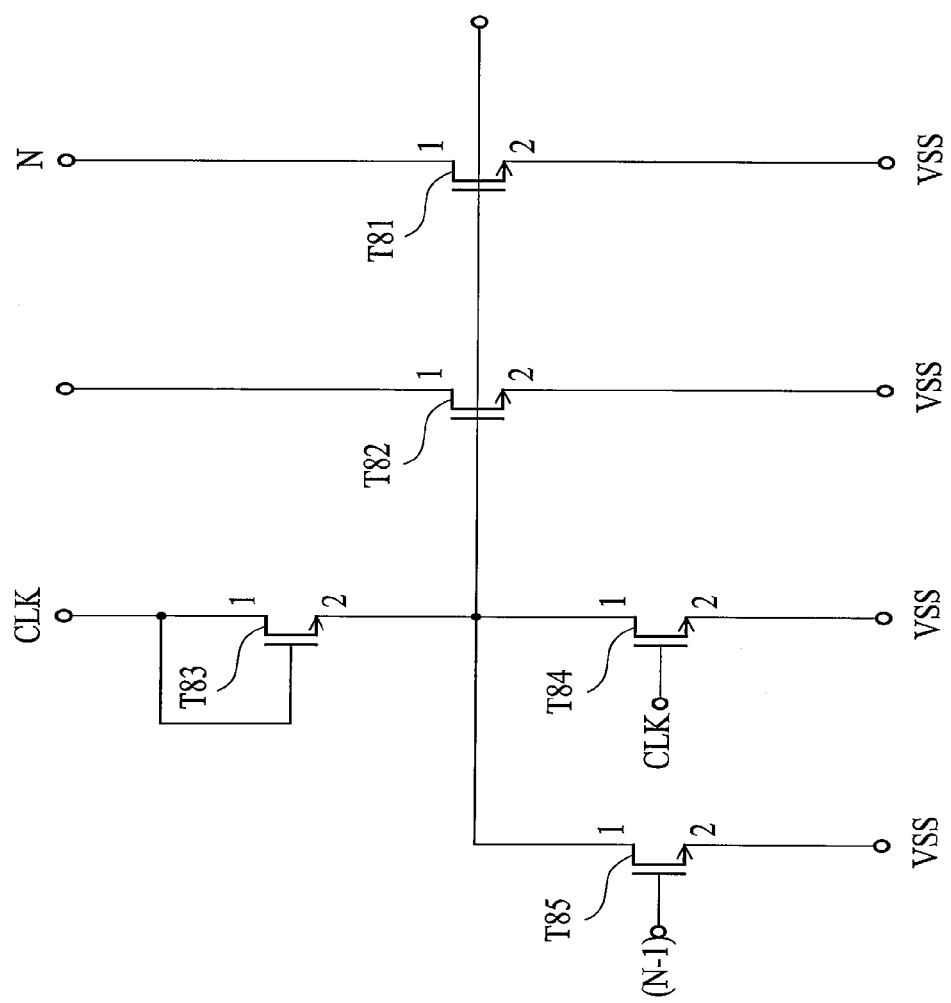
FIG. 8 is a circuit diagram of an embodiment of the second pull-down module 62 of FIG. 6A.

FIG. 8 is a circuit diagram of an embodiment of the second pull-down module 62 of FIG. 6A. The first source/drain of transistor T81 is coupled to the output signal N, and the second source/drain of transistor T81 is coupled to the second voltage level Vss. The second source/drain of transistor T82 is coupled to Vss, and the gate of transistor T82 is coupled to the gate of transistor T81. The gate and the first source/drain of transistor T83 is coupled to the second clock signal XCLK, and the second source/drain of transistor T83 is coupled to the gate of transistor T82. The second source/drain of transistor T84 is coupled to Vss, the gate of transistor T84 is coupled to the first clock signal CLK, and the first source/drain of transistor T84 is coupled to the gate of transistor T82. The second source/drain of transistor T85 is coupled to Vss, the gate of transistor T85 is coupled to the output signal N−1, and the first source/drain of transistor T85 is coupled to the gate of transistor T82. When the output signal N−1 is at low voltage level and the second clock signal XCLK is at high voltage level, transistor T85 turns off and transistors T81 and T82 turn on, thus, the output signal N is coupled to Vss.

Figure 9:
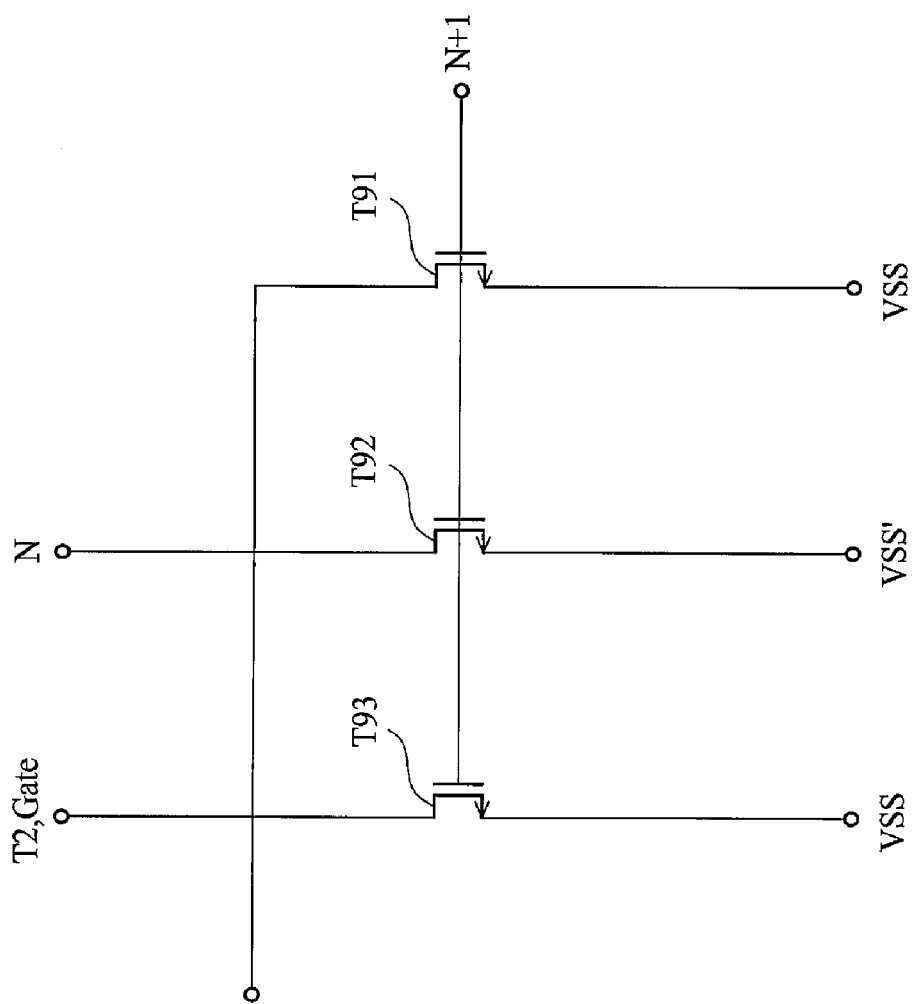
FIG. 9 is a circuit diagram of an embodiment of the third voltage level module 51 of FIG. 5.

FIG. 9 is a circuit diagram of an embodiment of the third voltage level module 51 of FIG. 5. The gate of transistor T91 is coupled to output signal N+1, and the second source/drain of transistor T91 is coupled to Vss. The first source/drain of transistor T92 is coupled to the output signal N, the second source/drain of transistor T92 is coupled to the third voltage level Vss', and the gate of transistor T92 is coupled to the gate of transistor T91. The gate of transistor T93 is coupled to the gate of transistor T91, and the second source/drain of transistor T93 is coupled to Vss. When the output signal N+1 is at high voltage level, transistors T91, T92 and T93 turn on, thus, the output signal N is coupled to the third voltage level Vss'.

Figure 10:
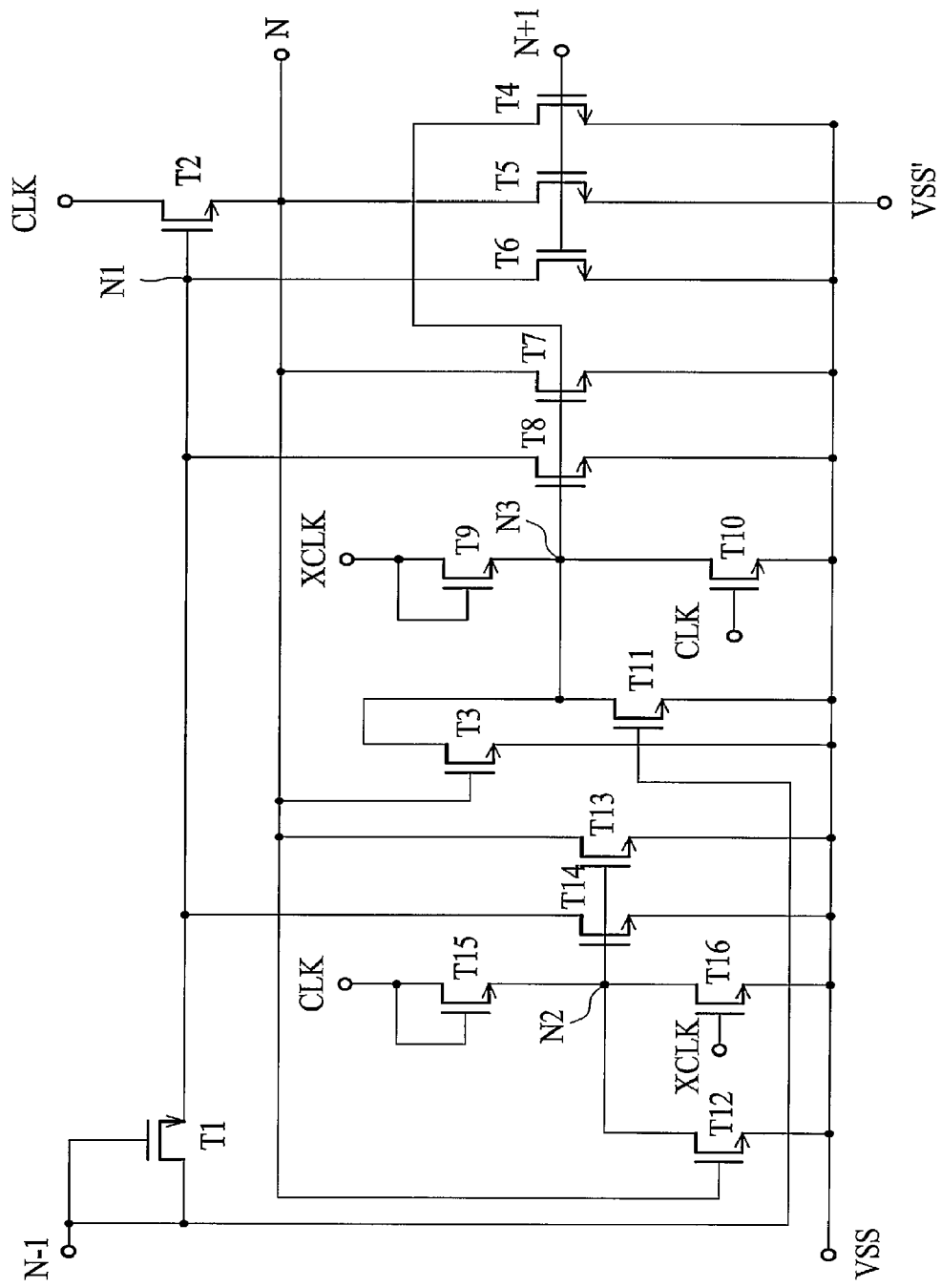
FIG. 10 is a circuit diagram of an embodiment of the shift register of the invention.

FIG. 10 is a circuit diagram of an embodiment of the shift register of the invention. The gate and first source/drain of transistor T1 are coupled to an output signal N−1 of a pre-stage shift register. The gate of transistor T2 is coupled to the second source/drain of transistor T1, the first source/drain of transistor T2 is coupled to a first clock signal CLK, and the second source/drain of transistor T2 is coupled to an output signal of shift register. The gate of transistor T3 is coupled to the output signal N, and the second source/drain of transistor T3 is coupled to a second voltage level Vss. The gate of transistor T4 is coupled to an output signal N+1 of a post-stage shift register, the first source/drain of transistor T4 is coupled to the first source/drain of transistor T3, and the second source/drain of transistor T4 is coupled to the Vss. The first source/drain of transistor T5 is coupled to the output signal N, the second source of transistor T5 is coupled to a third voltage level Vss', and the gate of transistor T5 is coupled to the gate of transistor T4. The gate of transistor T6 is coupled to the gate of transistor T4, the first source/drain of transistor T6 is coupled to the gate of transistor T2, and the second source/drain of transistor T6 is coupled to the Vss. The first source/drain of transistor T7 is coupled to the output signal N, the second source/drain of transistor T7 is coupled to Vss, and the gate of transistor T7 is coupled to the second source/drain of transistor T7. The second source/drain of transistor T8 is coupled to the Vss, the gate of transistor T8 is coupled to the gate of transistor T7, and the first source/drain of transistor T8 is coupled to the gate of transistor T2. The gate and first source/drain of transistor T9 is coupled to a second clock signal XCLK, and the second source/drain of transistor T9 is coupled to the gate of transistor T8. The second source/drain of transistor T10 is coupled to the Vss, thee gate of transistor T10 is coupled to the first clock signal CLK, and the first source/drain of transistor T10 is coupled to the gate of transistor T8. The second source/drain of transistor T11 is coupled to the Vss, the gate of transistor T11 is coupled to the output signal N−1, and the first source/drain of transistor. T1 is coupled to the gate of transistor T8 and the first source/drain of transistor T3. The gate of transistor T12 is coupled to the output signal N and the second source/drain of transistor T12 is coupled to the Vss. The first source/drain of transistor T13 is coupled to the output signal N, the second source/drain of transistor T13 is coupled to the Vss, and the gate of transistor T13 is coupled to the first source/drain of transistor T12. The gate of transistor T14 is coupled to the gate of transistor T13, the second source/drain of transistor T14 is coupled to the Vss, and the first source/drain of transistor T14 is coupled to the gate of transistor T2. The gate and the first source/drain of transistor T15 is coupled to a first clock signal CLK, and the second source/drain of transistor T15 is coupled to the gate of transistor T13. The second source/drain of transistor T13 is coupled to the Vss, the gate of transistor T16 is coupled to the second clock signal XCLK, and the first source/drain of transistor T16 is coupled to the gate of the transistor T13.

Figure 11:
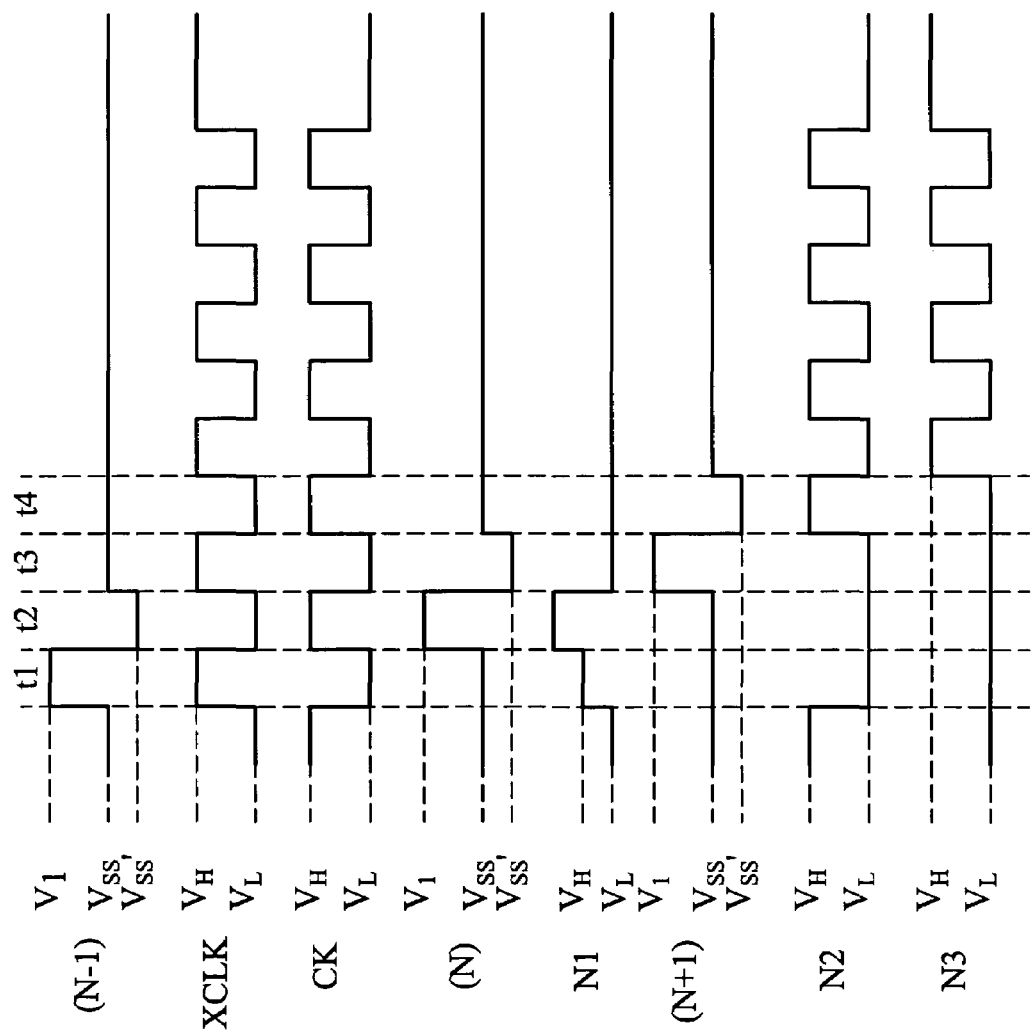
FIG. 11 is a waveform of the shift register of FIG. 10 according to the invention.

To further illustrate the shift register of FIG. 10, please refer to FIG. 11. FIG. 11 is a waveform of the shift register of FIG. 10 according to the invention. During the time period t1, the output signal N−1 is at a first voltage level V1, thus the transistors T1, T2 and T11 turn on and the voltage level of node N1 is at a high voltage level. The first clock signal CLK is also at the low voltage level during the time period t1, thus, the output signal N is at the second voltage level Vss.

During the time period t2, the output signal N−1 is pulled down to the third voltage level Vss'. The first clock signal CLK is at high voltage level and a coupling capacitor between the gate and the first source/drain is generated, thus, the voltage level of the node N1 increases due to the charging of the coupling capacitor. The output signal N is at the first voltage level V1 due to the switch-on of transistor T2 and the high voltage of the first clock signal CLK.

During the time period t3, the output signal N+1 of the post-stage shift register is at the first voltage level V1, thus transistors T4, T5 and T6 turn on. The voltage level of the node N1 is pulled down to the second voltage level Vss through the transistor T6, and the output signal N is pulled down to the third voltage level Vss'.

During the time period t4, the output signal N+1 is pulled to the third voltage level Vss', thus, the transistors T4, T5 and T6 turn off. The first clock signal CLK is at the high voltage level, thus the transistor T15 turns on and the voltage level of the node N2 is at the high voltage level. The transistor T13 turns on in response to the high voltage level of node N2, thus, the output signal is pulled up to the Vss from Vss'.

Additionally time periods t1~t4, the output signal stays in the second voltage level Vss via the transistor T13 when the first clock signal CLK is at high voltage level, and when the output signal N−1 is at the second or third voltage level and the second clock signal XCLK is at high voltage level, the output signal stays in the second voltage level Vss via the transistor T7.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift registers circuit having a series of cascading shift registers, comprising:
    a first transistor having a gate, a first source/drain and a second source/drain, wherein the gate and the first source/drain of the first transistor is coupled to an output signal of a pre-stage shift register;
    a second transistor having a gate, a first source/drain and a second source/drain, wherein the gate of the second transistor is coupled to the second source/drain of the first transistor, the first source/drain of the second transistor is coupled to a first clock signal, and the second source/drain of the second transistor is coupled to an output, wherein the output is at a first voltage level when the second transistor is on and the first clock signal is at a high voltage level; and
    a pull-down module being coupled to the output, the output signal of the pre-stage shift register, an output signal of a post-stage shift register, a second and a third voltage level, wherein the output is at the second voltage level when an output signal of the post-stage shift register is at the second or the third voltage level, and the output is coupled to the third voltage level when an output signal of the post-stage shift register is at the first voltage level.

2. The circuit as claimed in claim 1, wherein the pull-down module comprises a second voltage level pull-down module and a third voltage level pull-down module.

3. The circuit as claimed in claim 2, wherein the second voltage level pull-down module further comprises:
    a first pull-down module being coupled to the output and the first clock signal, wherein the output is coupled to the second voltage level when the first clock signal is at a high voltage level; and
    a second pull-down module being coupled to the output and the second clock signal, wherein the output is coupled to the second voltage level when the second clock signal is at a high voltage level.

4. The circuit as claimed in claim 3, wherein the second voltage level pull-down module further comprises a first switch to turn off the first pull-down module when the output is at the first voltage level.

5. The circuit as claimed in claim 3, wherein the second voltage level pull-down module further comprises a second switch to turn off the, second pull-down module when the output is at the first voltage level.

6. The circuit as claimed in claim 3, wherein the phase difference between the first clock signal and the second clock signal is 180°.

7. The circuit as claimed in claim 3, wherein the first clock signal has a duty cycle of 50% or less than 50%.

8. The circuit as claimed in claim 1, wherein the third voltage level is lower than the second voltage level.

9. The circuit as claimed in claim 2, wherein the third voltage level pull-down module further comprises:
    a fourth transistor having a gate, a first source/drain and a second source/drain, wherein the gate of the fourth transistor is coupled to the output signal of the post-stage shift register, and the second source/drain of the fourth transistor is coupled to the second voltage level;
    a fifth transistor having a gate, a first source/drain and a second source/drain, wherein the first source/drain of the fifth transistor is coupled to the output, the second source/drain of the fifth transistor is coupled to the third voltage level, and the gate of the fifth transistor is coupled to the gate of the fourth transistor; and
    a sixth transistor having a gate, a first source/drain and a second source/drain, wherein the gate of the sixth transistor is coupled to the gate of the fourth transistor, the second source/drain of the sixth transistor is coupled to the second voltage level, and the first source/drain of the sixth transistor is coupled to the gate of the second transistor.

10. The circuit as claimed in claim 3, wherein the second pull-down module further comprises:
    a seventh transistor having a gate, a first source/drain and a second-source/drain, wherein the first source/drain of the seventh transistor is coupled to the output, and the second source/drain of the seventh transistor is coupled to the second voltage level;
    a eighth transistor having a gate, a first source/drain and a second source/drain, wherein the second source/drain of the eighth transistor is coupled to the second voltage level, the gate of the eighth transistor is coupled to the gate of the seventh transistor, and first source/drain of the eighth transistor is coupled to the gate of the second transistor;
    a tenth transistor having a gate, a first source/drain and a second source/drain, wherein the second source/drain of the tenth transistor is coupled to the second voltage level, the gate of the tenth transistor is coupled to the first clock signal, and the first source/drain of the tenth transistor is coupled to the gate of the eighth transistor; and a eleventh transistor having a gate, a first source/drain and a second source/drain, wherein the second source/drain of the eleventh transistor is coupled to the second voltage level, the gate of the eleventh transistor is coupled to the output signal of the pre-stage shift register, and the first source/drain of the eleventh transistor is coupled to the gate of the eighth transistor.

11. The circuit as claimed in claim 3, wherein the first pull-down module further-comprises:

a thirteenth transistor having a gate, a first source/drain and a second source/drain, wherein the first source/drain of the thirteenth transistor is coupled to the output, and the second source/drain of the thirteenth transistor is coupled to the second voltage level;

a fourteenth transistor having a gate, a first source/drain and a second source/drain, wherein the second source/drain of the fourteenth transistor is coupled to the second voltage level, the gate of the fourteenth transistor is coupled to the gate of the thirteenth transistor, and the first source/drain of the fourteenth transistor is coupled to the gate of the second transistor;

a fifteenth transistor having a gate, a first source/drain and a second source/drain, wherein the gate and the first source/drain of the fifteenth transistor are coupled to the first clock signal, and the second source/drain of the fifteenth transistor is coupled to the gate of the thirteenth transistor; and a sixteenth transistor having a gate, a first source/drain and a second source/drain, wherein the second source/drain of the sixteenth transistor is coupled to the second voltage level, the gate of sixteenth transistor is coupled to the second clock signal, and the first source/drain of sixteenth transistor is coupled to the gate of thirteenth transistor.

12. The circuit as claimed in claim 5, wherein the second switch is a third transistor having a gate, a first source/drain and a second source/drain, wherein the gate of third transistor is coupled to the output, the first source/drain of third transistor is coupled to the second pull-down module, and the second source/drain of third transistor is coupled to the second voltage level.

13. The circuit as claimed in claim 4, wherein the first switch is a twelfth transistor having a gate, a first source/drain and a second source/drain, wherein the gate of twelfth transistor is coupled to the output, the first source/drain of twelfth transistor is coupled to the first pull-down module, and the second source/drain of twelfth transistor is coupled to the second voltage level.

14. The circuit as claimed in claim 1, wherein the output signal of the pre-stage shift register is a start pulse when the shift register is a first stage of shift register.

15. A shift register circuit with three driving voltage levels formed on a glass substrate, having a cascade of shift registers, comprising:

a first transistor having a gate, a first source/drain and a second source/drain, wherein the gate and the first source/drain of the first transistor is coupled to an output signal of a pre-stage shift register;

a second transistor having a gate, a first source/drain and a second source/drain, wherein the gate of the second transistor is coupled to the second source/drain of the first transistor, the first source/drain of the second transistor is coupled to a first clock signal, and the second source/drain of the second transistor is coupled to an output, wherein the output is at a first voltage level when the second transistor is on and the first clock signal is at a high voltage level;

a third transistor having a gate, a first source/drain and a second source/drain, wherein the gate of the third transistor is coupled to the output, and the second source/drain of the third transistor is coupled to a second voltage level;

a fourth transistor having a gate, a first source/drain and a second source/drain, wherein the gate of the fourth transistor is coupled to an output signal of a post-stage shift register, the first source/drain of the fourth transistor is coupled to the first source/drain of the third transistor, and the second source/drain is coupled to the second voltage level;

a fifth transistor having a gate, a first source/drain and a second source/drain, wherein the first source/drain of the fifth transistor is coupled to the output, the second source/drain of the fifth transistor is coupled to a third voltage level, and the gate of the fifth transistor is coupled to the gate of the fourth transistor;

a sixth transistor having a gate, a first source/drain and a second source/drain, wherein the gate of the sixth transistor is coupled to the gate of the fourth transistor, the second source/drain of the sixth transistor is coupled to the second voltage level, and the first source/drain is coupled to the gate of the second transistor;

a seventh transistor having a gate, a first source/drain and a second source/drain, wherein the first source/drain of the seventh transistor is coupled to output, the second source/drain of the seventh transistor is coupled to the second voltage level, and the gate of the seventh transistor is coupled to second source/drain of the fourth transistor;

an eighth transistor having a gate, a first source/drain and a second source/drain, wherein the first source/drain of the eighth transistor is coupled to the gate of the second transistor, the second source/drain of the eighth transistor is coupled to the second voltage level, and the gate of the eighth transistor is coupled to the gate of the seventh transistor;

a ninth transistor having a gate, a first source/drain and a second source/drain, wherein the gate and the first source/drain of the ninth transistor is coupled to a second clock signal, and the second source/drain of the ninth transistor is coupled to the gate of the eighth transistor;

a tenth transistor having a gate, a first source/drain and a second source/drain, wherein the second source/drain of the tenth transistor is coupled to the second voltage level, the gate of the tenth transistor is coupled to the first clock signal, and the first source/drain of the tenth transistor is coupled to the gate of the eighth transistor;

a eleventh transistor having a gate, a first source/drain and a second source/drain, wherein the second source/drain of the eleventh transistor is coupled to the second voltage level, the gate of the eleventh transistor is coupled to the output signal of the pre-stage shift register;

a twelfth transistor having a gate, a first source/drain and a second source/drain, wherein the second source/drain of twelfth transistor is coupled to the second voltage level, and the gate of twelfth transistor is coupled to the output;

a thirteenth transistor having a gate, a first source/drain and a second source/drain, wherein the first source/ drain of the thirteenth transistor is coupled to the output, the second source/drain of the thirteenth transistor is coupled to the second voltage level, and the gate of the thirteenth transistor is coupled to the first source/drain of the twelfth transistor;

a fourteenth transistor having a gate, a first source/drain and a second source/drain, wherein the second source/drain of the fourteenth transistor is coupled to the second voltage level, the gate of the fourteenth transistor is coupled to the gate of the thirteenth transistor, and the first source/drain of the fourteenth transistor is coupled to the gate of the second transistor;

a fifteenth transistor having a gate, a first source/drain and a second source/drain, wherein the gate and the first source/drain of the fifteenth transistor are coupled to the first clock signal, and the second source/drain of the fifteenth transistor is coupled to the gate of the thirteenth transistor; and a sixteenth transistor having a gate, a first source/drain and a second source/drain, wherein the second source/drain of the sixteenth transistor is coupled to the second voltage level, the gate of sixteenth transistor is coupled to the second clock signal, and the first source/drain of sixteenth transistor is coupled to the gate of thirteenth transistor.

16. The circuit as claimed in claim 15, wherein the transistors are NMOS type transistors formed on a glass substrate.

17. The circuit as claimed in claim 15, wherein the transistors are amorphous Si transistors formed on a glass substrate.

18. The circuit as claimed in claim 15, wherein the phase difference between the first clock signal and the second clock signal is 180°.

19. The circuit as claimed in claim 15, wherein the first clock signal has a duty cycle of 50% or less than 50%.

20. The circuit as claimed in claim 15, wherein the third voltage level is lower than the second voltage level.

21. The circuit as claimed in claim 15, wherein the output signal of the pre-stage shift register is a start pulse when the shift register is a first stage of shift register.

* * * * *